United States Patent
Furuoya

(10) Patent No.: US 6,713,134 B2
(45) Date of Patent: Mar. 30, 2004

(54) APPARATUS FOR SPIN-COATING SEMICONDUCTOR SUBSTRATE AND METHOD OF DOING THE SAME

(75) Inventor: Shuichi Furuoya, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 168 days.

(21) Appl. No.: 09/854,614

(22) Filed: May 14, 2001

(65) Prior Publication Data

US 2001/0029885 A1 Oct. 18, 2001

Related U.S. Application Data

(62) Division of application No. 09/453,428, filed on Dec. 2, 1999, now Pat. No. 6,352,589.

(30) Foreign Application Priority Data

Dec. 7, 1998 (JP) .......................... 10-346766

(51) Int. Cl.[7] .................................. B05D 1/04
(52) U.S. Cl. .................. 427/473; 427/458; 427/475; 427/486; 427/240; 427/425; 118/623; 118/624; 118/52; 118/320; 438/758
(58) Field of Search ................ 427/240, 425, 427/458, 473, 486, 475; 118/52, 320, 623, 624; 438/758

(56) References Cited

U.S. PATENT DOCUMENTS 5,456,945 A * 10/1995 McMillan et al. .......... 427/252
5,935,331 A * 8/1999 Naka et al. ................. 118/319

FOREIGN PATENT DOCUMENTS

| JP | 4-135667 A | * | 5/1992 |
| JP | 5-259053 | | 10/1993 |
| JP | 8-153669 A | * | 6/1996 |
| JP | 8-167551 A | * | 6/1996 |

OTHER PUBLICATIONS

JPO Computer translation of JP 8–153669 A, published Nov. 6, 1996.*

* cited by examiner

Primary Examiner—Shrive P. Beck
Assistant Examiner—Kirsten Crockford Jolley
(74) Attorney, Agent, or Firm—Choate, Hall & Stewart

(57) ABSTRACT

There is provided an apparatus for spin-coating a semiconductor substrate, including (a) a rotary table rotatable in opposite directions, (b) a nozzle dropping coating material onto a semiconductor substrate lying on the rotary table, (c) an electrode having a ring-shaped cross-section and disposed around the rotary table, and (d) a power source applying a voltage to the electrode, the voltage having an electric polarity opposite to an electric polarity of the coating material. Coating material dropped onto the semiconductor substrate is attracted to an electric field generated by the electrode around the semiconductor substrate. Hence, the coating material is not concentrated around a center of the semiconductor substrate, but is facilitated to uniformly spread over the semiconductor substrate, ensuring formation of a coating layer having a uniform thickness.

7 Claims, 9 Drawing Sheets

APPARATUS FOR SPIN-COATING SEMICONDUCTOR SUBSTRATE AND METHOD OF DOING THE SAME

CROSS REFERENCE TO RELATED APPLICATIONS

This application is a divisional of U.S. patent application Ser. No. 09/453,428 filed Dec. 2, 1999, now U.S. Pat. No. 6,352,589.

BACKGROUND OF THE INVENTION

1. Field of the Invention

The invention relates to an apparatus for spin-coating a semiconductor substrate, and a method of spin-coating a semiconductor substrate.

2. Description of the Related Art

There are many methods of coating a semiconductor substrate such as a silicon wafer and a mask substrate with chemical such as photoresist. A typical one among such methods is spin-coating.

In spin-coating, as illustrated in FIG. 1, a semiconductor substrate 1 is fixed on a rotary table 2 by means of a vacuum wafer chuck 3. Chemical 5 is dropped onto a center 1a of the semiconductor substrate 1 from an application nozzle 4 having a vertical axis A.

Then, a spindle shaft 6 is rotated to thereby rotate the rotary table 2 and accordingly the semiconductor substrate 1 in a direction indicated with an arrow B. As a result, there is generated centrifugal force exerts on the chemical 5. The chemical 5 is uniformly spread over the semiconductor substrate 1, and thus, there is formed a chemical coating layer 5a having a uniform thickness.

A thickness of the chemical coating layer 5a is dependent on various factors, in particular, on a viscosity of the chemical 5.

The above-mentioned spin-coating is accompanied with a problem that the chemical coating layer 5a has a locally increased thickness at the center 1a and a periphery 1b of the semiconductor substrate 1. The reason is as follows. The centrifugal force is equal to almost zero in the vicinity of the center 1a of the semiconductor substrate 1. Hence, the centrifugal force does not exert on the chemical around the center 1a of the semiconductor substrate 1, resulting in an increase in a thickness of the chemical coating layer 5 at the center 1a. Since a peripheral speed of the semiconductor substrate 1 in the vicinity of the periphery 1b is relatively high, solvent contained in the chemical 5 is facilitated to volatilize, resulting in an increase in a thickness of the chemical coating layer 5 at the periphery 1b.

As mentioned above, spin-coating cannot always provide a uniform thickness in a chemical coating layer. In order to solve this problem, many attempts have been suggested.

FIG. 2 illustrates one of apparatuses for spin-coating a semiconductor substrate having been suggested in order to solve the problem.

With reference to FIG. 2, in a chamber 11 of the spin-coating apparatus, there is installed a chuck designed to be rotatably driven by a motor 12. Above the chuck 13 is situated a nozzle 15 through which chemical is dropped onto a wafer 14 fixed on the chuck 13.

The chamber 11 is formed with a drain 11a through which residual chemical not used for coating is discharged and a discharge port 11b through which chemical scattering in the chamber 11 is discharged.

An electrode 16 is embedded in the chuck 13. The electrode 16 is electrically connected to a negative terminal of a dc power source 17.

The spin-coating apparatus illustrated in FIG. 2 operates as follows.

First, the wafer 14 onto which chemical is to be applied is fixed on the chuck 13, and then, chemical 18 is dropped onto a center of the wafer 14 through the nozzle 15.

Then, the wafer 14 is rotated at 1000 rpm to thereby uniformly spread the chemical 18 over the wafer 14. Thus, there is formed a chemical coating layer having a uniform thickness.

In accordance with the above-mentioned spin-coating apparatus, it is possible to apply the chemical onto the wafer 14 such that spaces between projections formed on a surface of the wafer 14 are filled with the chemical, if such spaces are relatively long, for instance, if such spaces are equal to or longer than 0.5 $\mu$m.

However, when such spaces are relatively small, for instance, if such spaces are equal to or smaller than 0.1 $\mu$m, it was impossible to fill the chemical in the spaces formed between projections, due to surface tension of the chemical 18 and/or resistance of air sealed between the spaces.

Hence, the spin-coating apparatus illustrated in FIG. 2 is accompanied with a problem that a resultant photoresist has a pattern different from a designed pattern.

In order to solve this problem, Japanese Unexamined Patent Publication No. 4-135667 has suggested such an apparatus for spin-coating a semiconductor substrate as illustrated in FIG. 3. Parts or elements that correspond to those of the spin-coating apparatus illustrated in FIG. 2 have been provided with the same reference numerals.

The illustrated spin-coating apparatus is designed to include a second electrode 19 embedded in the nozzle 15 as well as the electrode 16 embedded in the chuck 13. The second electrode 19 is electrically connected to a positive terminal of a dc power source 20.

In the spin-coating apparatus illustrated in FIG. 3, dc voltages having opposite polarities are applied to the electrode 16 embedded in the chuck 13 and the second electrode 19 embedded in the nozzle 15. Hence, there is generated Coulomb force between electric charges existing on a surface of the chemical 18 having been dropped from the nozzle 15 and electric charges existing on a surface of the wafer 14 placed on the chuck 13. Thus, it is possible to fill the chemical 18 in small spaces formed between projections formed on the wafer 14, which ensures to avoid formation of a photoresist having a pattern different from a designed pattern.

Japanese Unexamined Patent Publication No. 5-259053 has suggested an apparatus for spin-coating a semiconductor substrate, in order to solve the problem that a resultant photoresist has a pattern different from a designed pattern.

FIG. 4 illustrates the suggested spin-coating apparatus. The illustrated spin-coating apparatus is comprised of a rotary table 22 fixed to a spindle shaft 21 for rotation, an electrode table 24 facing the rotary table 22 and designed to raise and lower relative to the rotary table 22 by means of a support shaft 23, and a nozzle 27 for dropping chemical 26 onto a wafer 25, situated above the rotary table 22 and designed to be vertically movable.

A plurality of lower electrodes 28 are coaxially arranged and equally spaced in the rotary table 22. The lower electrodes 28 are electrically connected to a power source (not illustrated) through wirings 29 arranged in the spindle shaft 21.

A plurality of upper electrodes 30 are coaxially arranged and equally spaced in the electrode table 24. The upper electrodes 30 are electrically connected to a power source (not illustrated) through wirings 31 arranged in the support shaft 23.

The spin-coating apparatus illustrated in FIG. 4 operates as follows.

After chemical 26 has been dropped onto the wafer 25 from the nozzle 27, the nozzle 27 is raised. Then, the electrode table 24 is lowered to a certain position.

Then, the rotary table 22 is rotated to thereby spread the chemical 26 over the wafer 25. During the rotary table 22 is being rotated, predetermined voltages are applied to both the lower electrodes 28 and the upper electrodes 30. The application of the voltages makes it possible to uniformly spread the chemical 26 over the wafer 25, ensuring photoresist having a desired pattern.

However, the spin-coating apparatuses illustrated in FIGS. 3 and 4 are accompanied with such a problem as mentioned below.

In the spin-coating apparatus illustrated in FIG. 3, since the second electrode 19 faces only a central region of the electrode 16, an electric field formed between the electrode 16 and the second electrode 19 has an intensity which is great only in a central region, and hence, an electric field formed around the electrode 16 can have a small intensity.

As a result, the chemical 18 tends to be concentrated to a central region of the wafer 14 rather than a periphery of the wafer 14. Thus, the spin-coating apparatus illustrated in FIG. 3 cannot always provide a uniform thickness in a chemical coating layer.

In the spin-coating apparatus illustrated in FIG. 4, since the lower electrodes 28 and the upper electrodes 30 have to be embedded in the rotary table 22 and the electrode table 24, respectively, such that the electrodes 28 and 30 face each other, high accuracy with which the electrodes 28 and 30 are positioned is required, and in addition, it is unavoidable for the spin-coating apparatus to have a complicated structure.

SUMMARY OF THE INVENTION

In view of the above-mentioned problems in the conventional spin-coating apparatuses, it is an object of the present invention to provide an apparatus for spin-coating a semiconductor substrate, which is capable of providing a uniform thickness in a chemical coating layer to be formed on a wafer, without an increase in complexity in a structure of a spin-coating apparatus.

It is also an object of the present invention to provide a method of spin-coating a semiconductor substrate, which is capable of doing the same.

In one aspect of the present invention, there is provided an apparatus for spin-coating a semiconductor substrate, including (a) a rotary table rotatable in opposite directions, (b) a nozzle dropping coating material onto a semiconductor substrate lying on the rotary table, (c) an electrode having a ring-shaped cross-section and disposed around the rotary table, and (d) a power source applying a voltage to the electrode, the voltage having an electric polarity opposite to an electric polarity of the coating material.

In the above-mentioned spin-coating apparatus, a voltage having an electric polarity opposite to that of the coating material such as chemical is applied to the electrode formed to surround the rotary table therein. Hence, an electric field is generated around the rotary table and accordingly a semiconductor substrate fixed on the rotary table. Since the coating material is attracted to the electric field, the coating material is uniformly coated on the semiconductor substrate not only in a central region but also in a peripheral region. Thus, the spin-coating apparatus makes it possible to form a coating layer having a uniform thickness, on a semiconductor substrate.

The power source may be designed to apply a voltage to the electrode, the voltage changing its level periodically with the lapse of time.

In this arrangement, as the voltage varies, coating material is periodically coated over a semiconductor substrate. That is, the coating material is coated over a semiconductor substrate in a scan mode, ensuring that the coating material is uniformly coated over a semiconductor substrate. This arrangement is useful in particular for a semiconductor substrate having a great diameter.

It is preferable that the electrode is designed to be rotatable about a rotation axis of the rotary table.

By designing the electrode rotatable about the rotary table as well as designing the rotary table rotatable, it would be possible to cancel a difference in an intensity of an electric field among regions of the electric field, ensuring generation of an electric field having a uniform intensity.

It is preferable that the electrode is able to raise and lower relative to the rotary table.

By designing the electrode to be vertically movable relative to the rotary table, a semiconductor could be readily placed on the rotary table.

It is preferable that the spin-coating apparatus further includes a second electrode embedded in the rotary table.

In accordance with this embodiment, an electric field generated by the second electrode cooperates with an electric field generated by the electrode to thereby ensure to uniformly coat coating material over a semiconductor substrate.

It is preferable that the power source applies such a voltage to the electrode that a force applied to the coating material by an electric field generated by the electrode is almost equal to a gravitational force exerted on the coating material.

An electric field generated by the electrode exerts a substantially horizontal force on coating material. A gravitational force vertically downwardly exerts on coating material. Hence, it would be possible to exert a force on coating material which force is directed at about 45 degrees downwardly, by controlling the voltage such that the force exerted on coating material by an electric field generated by the electrode is almost equal to the gravitational force exerting on coating material. As a result, it would be possible to direct coating material towards a periphery of a semiconductor substrate.

There is further provided an apparatus for spin-coating a semiconductor substrate, including (a) a rotary table rotatable in opposite directions, (b) a nozzle dropping coating material onto a semiconductor substrate lying on the rotary table, (c) a plurality of circumferentially-split electrodes cooperating with one another to thereby form an electrode having a ring-shaped cross-section and disposed around the rotary table, and (d) a power source applying a voltage to the circumferentially-split electrodes, the voltage having an electric polarity opposite to an electric polarity of the coating material.

For instance, a circumferentially-split electrode may be designed to be a quadrant. By designing the electrode to be comprised of a plurality of circumferentially-split electrodes, the electrode may be fabricated more readily than an electrode to be formed as a single piece. If one of circumferentially-split electrodes were broken, only the broken one can be replaced with a new one, ensuring no necessity of replacing an entire electrode with a new one.

It is preferable that the power source is comprised of a plurality of second power sources each of which is associated with each of the circumferentially-split electrodes, each of the second power sources applying an independently controlled voltage to the associated circumferentially-split electrode.

By applying different voltages to the circumferentially-split electrodes, it is possible to generate electric fields having different intensities in association with the circumferentially-split electrodes. For instance, when elements are formed on a semiconductor substrate at different densities and coating material is intended to be concentrated at a predetermined region of the semiconductor substrate, a greater voltage is applied to circumferentially-split electrodes located close to the predetermined region than voltages to be applied to the other circumferentially-split electrodes. As a result, an electric field having a greater intensity is generated at the predetermined region, which ensures that a greater amount of coating material is coated on the predetermined region of the semiconductor substrate than an amount of coating material to be coated on other regions of the semiconductor substrate.

It is preferable that each of the second power sources applies a voltage to the associated circumferentially-split electrode, the voltage changing its level periodically with the lapse of time.

It is preferable that the second power sources applying a voltage to the circumferentially-split electrodes situated facing each other, the voltage changing its level periodically with the lapse of time.

In this arrangement, as the voltage varies, coating material is periodically coated in regions associated with facing circumferentially-split electrodes in a semiconductor substrate. That is, the coating material is coated over a semiconductor substrate in a scan mode, ensuring that the coating material is uniformly coated over a semiconductor substrate. This arrangement is useful in particular for a semiconductor substrate having a great diameter.

There is still further provided an apparatus for spin-coating a semiconductor substrate, including (a) a rotary table rotatable in opposite directions, (b) a nozzle dropping coating material onto a semiconductor substrate lying on the rotary table, (c) a plurality of vertically-vertically-split electrodes cooperating with one another to thereby form an electrode having a ring-shaped cross-section and disposed around the rotary table, and (d) a power source applying a voltage to the vertically-split electrodes, the voltage having an electric polarity opposite to an electric polarity of the coating material.

For instance, an electric field can be concentrated at a periphery of a semiconductor substrate more intensively by applying a voltage only to lower vertically-vertically-split electrodes than a case where a voltage is applied to all of vertically-vertically-split electrodes to thereby generate an electric field. This ensures effective concentration of coating material onto a surface of a semiconductor substrate.

It is preferable that the power source is comprised of a plurality of second power sources each of which is associated with each of the vertically-split electrodes, each of the second power sources applying an independently controlled voltage to the associated vertically-split electrode.

It is preferable that each of the second power sources applies a voltage to the associated vertically-split electrode, the voltage changing its level periodically with the lapse of time.

In another aspect of the present invention, there is provided a method of spin-coating a semiconductor substrate, including the steps of (a) dropping coating material onto a semiconductor substrate, (b) rotating the semiconductor substrate about a center thereof, and (c) generating an electric field around the semiconductor substrate, the electric field having an electric polarity opposite to an electric polarity of the coating material.

It is preferable that the method further includes the step of locally varying an intensity of the electric field circumferentially of the semiconductor substrate.

It is preferable that an intensity of the electric field is varied in regions of the semiconductor substrate circumferentially facing each other.

It is preferable that the method further includes the step of locally varying an intensity of the electric field vertically of the semiconductor substrate.

It is preferable that the method further includes the step of varying an intensity of the electric field periodically with lapse of time.

It is preferable that the method further includes the step of generating a second electric field below the semiconductor substrate by a voltage having an electric polarity opposite to an electric polarity of the coating material.

It is preferable that a force applied to the coating material by the electric field is almost equal to a gravitational force exerted on the coating material.

The advantages obtained by the aforementioned present invention will be described hereinbelow.

In accordance with the above-mentioned present invention, coating material dropped onto a semiconductor substrate is attracted to an electric field generated by the electrode around the semiconductor substrate. Hence, the coating material is not concentrated at a center of the semiconductor substrate, but is facilitated to uniformly spread over the semiconductor substrate, ensuring a uniform thickness in a coating material layer to be formed over the semiconductor substrate.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

[First Embodiment]

Figure 1:
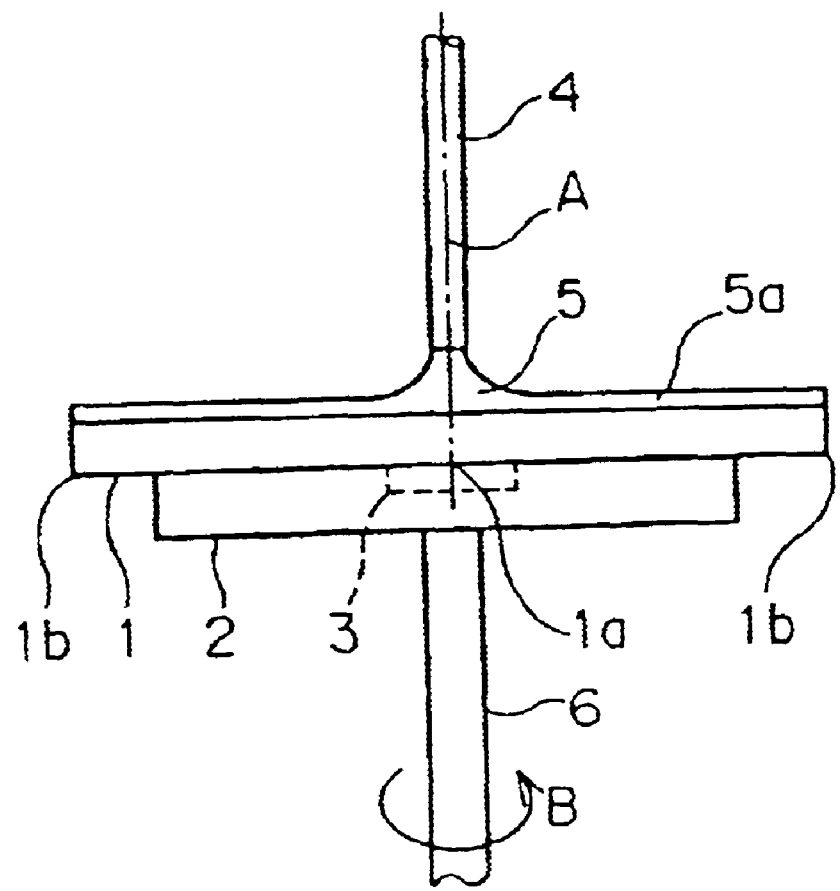
FIG. 1 is a front view of an apparatus for spin-coating a semiconductor substrate.
Figure 2:
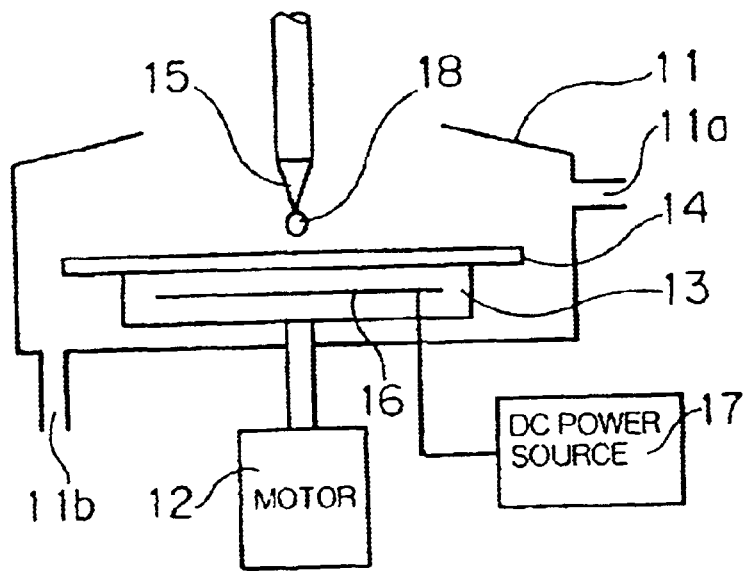
FIG. 2 is a schematic view of a conventional apparatus for spin-coating a semiconductor substrate.
Figure 3:
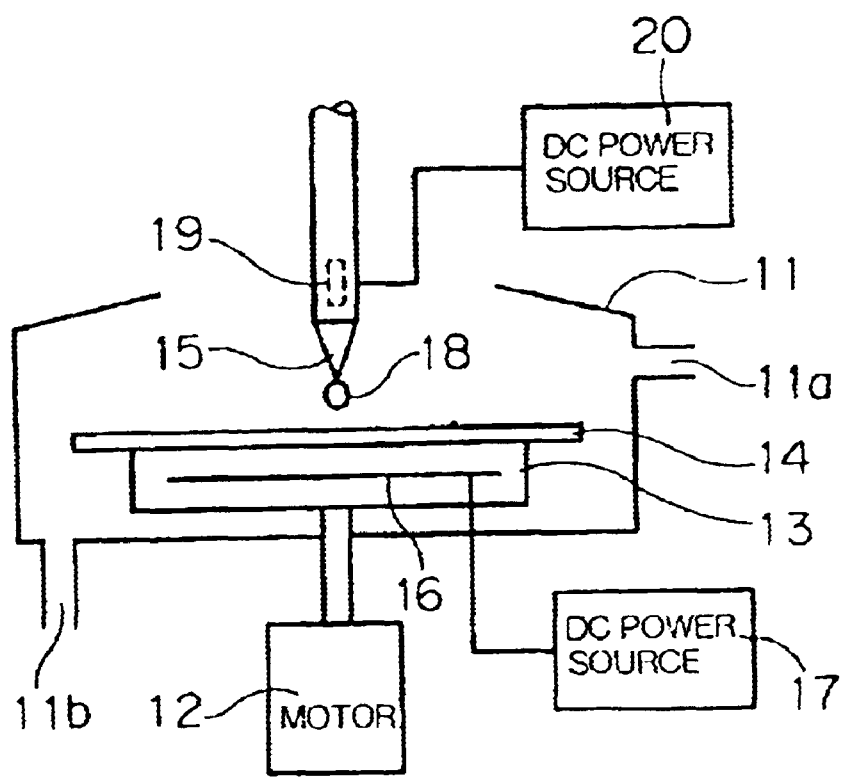
FIG. 3 is a schematic view of another conventional apparatus for spin-coating a semiconductor substrate.
Figure 4:
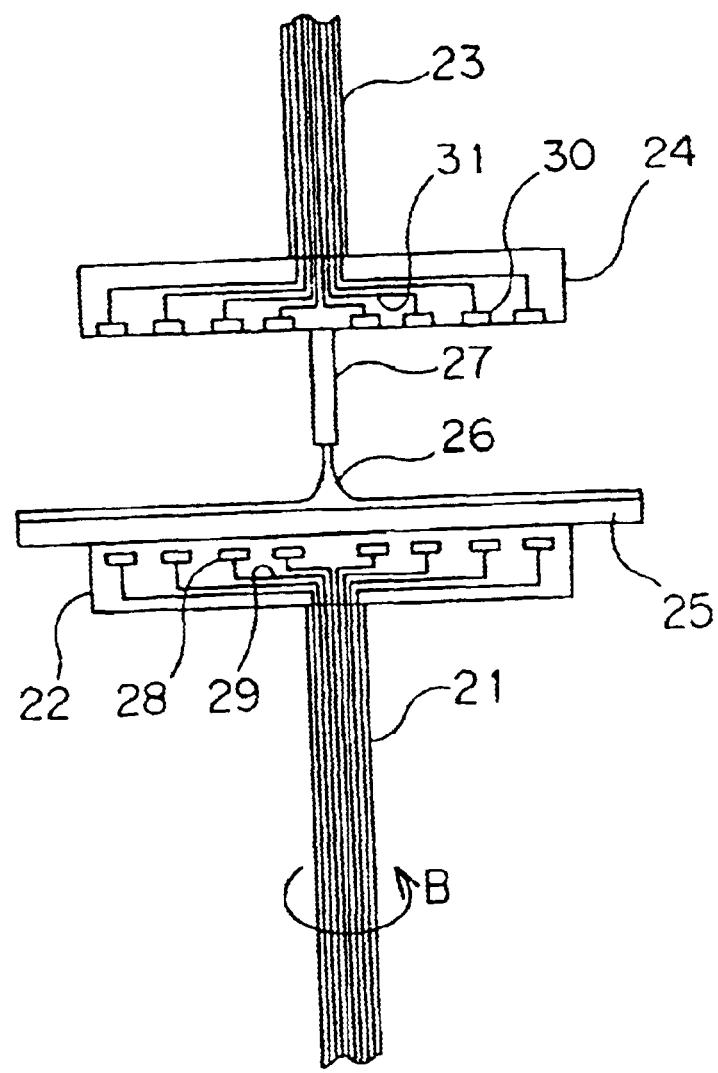
FIG. 4 is a schematic view of still another conventional apparatus for spin-coating a semiconductor substrate.
Figure 5:
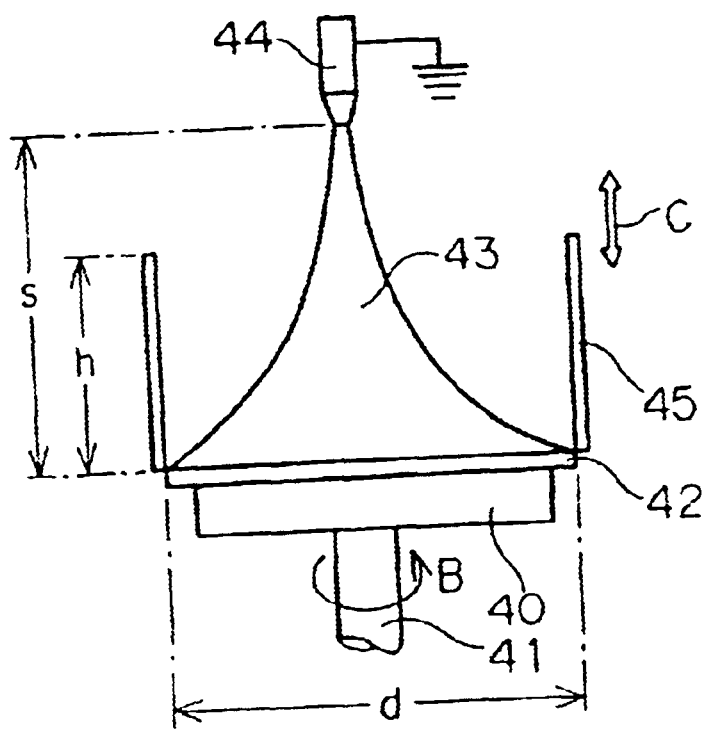
FIG. 5 is a schematic view of an apparatus for spin-coating a semiconductor substrate, in accordance with the first embodiment of the present invention.
Figure 6:
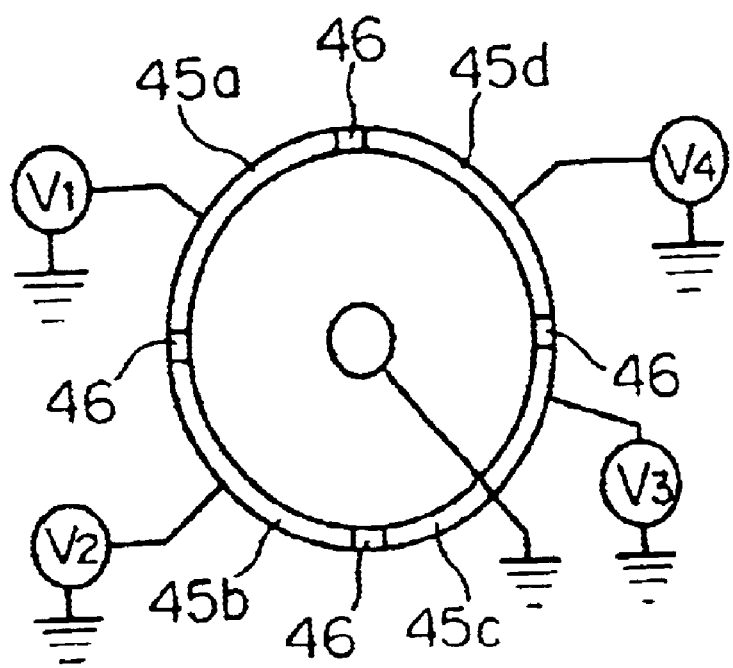
FIG. 6 is a top plan view of the spin-coating apparatus illustrated in FIG. 5.

FIGS. 5 and 6 illustrate an apparatus for spin-coating a semiconductor substrate, in accordance with the first embodiment.

As illustrated in FIG. 5, the spin-coating apparatus in accordance with the first embodiment is comprised of a rotary table 40 designed rotatable in opposite directions, a spindle shaft 41 connected to and rotating the rotary table 40, a spray nozzle 44 dropping chemical 43 onto a semiconductor substrate 42 lying on the rotary table 42, and an electrode 45 having a ring-shaped cross-section and disposed around the rotary table 40.

As illustrated in FIG. 6, the electrode 45 is comprised of first to fourth quadrant electrodes 45a, 45b, 45c and 45d connected to one another to thereby form a ring-shaped electrode. Electrical insulators 46 are sandwiched between the first to fourth quadrant electrodes 45a, 45b, 45c and 45d.

The first to fourth quadrant electrodes 45a, 45b, 45c and 45d are electrically connected to first to fourth power sources $V_1$, $V_2$, $V_3$ and $V_4$, respectively. The first to fourth power sources $V_1$, $V_2$, $V_3$ and $V_4$ apply a voltage having an electric polarity opposite to an electric polarity of particles of the chemical 43, to the first to fourth quadrant electrodes 45a, 45b, 45c and 45d, respectively.

As illustrated with an arrow C in FIG. 5, the electrode 45 is designed to be able to raise and lower relative to the rotary table 40.

The spray nozzle 44 is grounded.

The spin-coating apparatus having such a structure as mentioned above is used as follows.

First, the electrode 45 is kept being raised relative to the rotary table 40. Then, the semiconductor substrate 42 is fixed on the rotary table 40 by means of a vacuum chuck, for instance.

Then, the electrode 45 is lowered down to such a level that a lower edge of the electrode 45 is level with an upper surface of the semiconductor substrate 42.

Then, the chemical 43 is dropped towards a center of the semiconductor substrate 42 from the spray nozzle 44. At the same time when the chemical 43 starts to be dropped, the power sources $V_1$, $V_2$, $V_3$ and $V_4$ start applying a voltage to the first to fourth quadrant electrodes 45a, 45b, 45c and 45d, respectively. Thus, there is generated a force which attracts the chemical 43, around the semiconductor substrate 42, and thus, the chemical 43 is attracted towards a periphery of the semiconductor substrate 42.

At the same time when the chemical 43 starts to be dropped, the spindle shaft 41 starts being rotated, namely, the rotary table 40 and accordingly the semiconductor substrate 42 start being rotated in a direction indicated with an arrow B, resulting in that there is generated centrifugal force by which the chemical 43 having been dropped onto the semiconductor substrate 42 is spread over the semiconductor substrate 42.

As mentioned above, in accordance with the spin-coating apparatus, it is possible to uniformly coat the chemical 43 at not only a center but also a periphery of the semiconductor substrate 42.

Hereinbelow is explained an example of the first embodiment.

First, there is explained a trajectory of particles of the chemical 43 having been dropped through the spray nozzle 44.

The particles of the dropped chemical 43 contain ions having positive and negative electric charges. When the power sources $V_1$, $V_2$, $V_3$ and $V_4$ apply a positive or negative voltage to the first to fourth quadrant electrodes 45a, 45b, 45c and 45d, respectively, attractive or repulsive force is exerted on particles containing negative ions.

Herein, it is assumed that an oxide film is etched through the use of hydrofluoric acid. Etchant for an oxide film is $HF^{2-}$, which is a negative ion. If voltages V1, V2, V3 and V4 (V1=V2=V3=V4=V>0) are applied to the first to fourth quadrant electrodes 45a, 45b, 45c and 45d, respectively, the particles containing negative ions are attracted towards the electrode 45, and hence, it would be possible to accomplish chemical flow directing to a periphery of the semiconductor substrate 42.

Herein, dimensions are defined as follows.

Mass of a particle of the chemical 43: M=1 g

The number of ions contained in a particle of 1 g: $N=3\times10^{17}$

Gravitational acceleration: g=9.8 m/s$^2$

Elementary quantity of an electric charge: $e=1.6\times10^{-19}$ C

Diameter of the electrode 45: d=20 cm

Height of the electrode 45: h=10 cm

Spacing between the spray nozzle 44 and the semiconductor substrate 42: s=10 cm

Radius of the semiconductor substrate 42: r=10 cm

In order to spread the particles of the chemical 43 all over the semiconductor substrate 42, a force generated by an electric field which the electrode 45 generates is designed to be almost equal to a gravitational force. Hence, the electric field E generated by the electrode 45 has to have an intensity E=Mg/Ne=200 (V/m). This means that the voltage to be applied to the electrode 45 is calculated as follows.

$$V=d\times E=40 \ (V)$$

Though the electrode 45 is circumferentially divided into four pieces 45a, 45b, 45c and 45d in the above-mentioned first embodiment, the number of pieces is not to be limited to four. The electrode 45 may be divided into 2, 3, 5 or greater.

[Second Embodiment]

Figure 7:
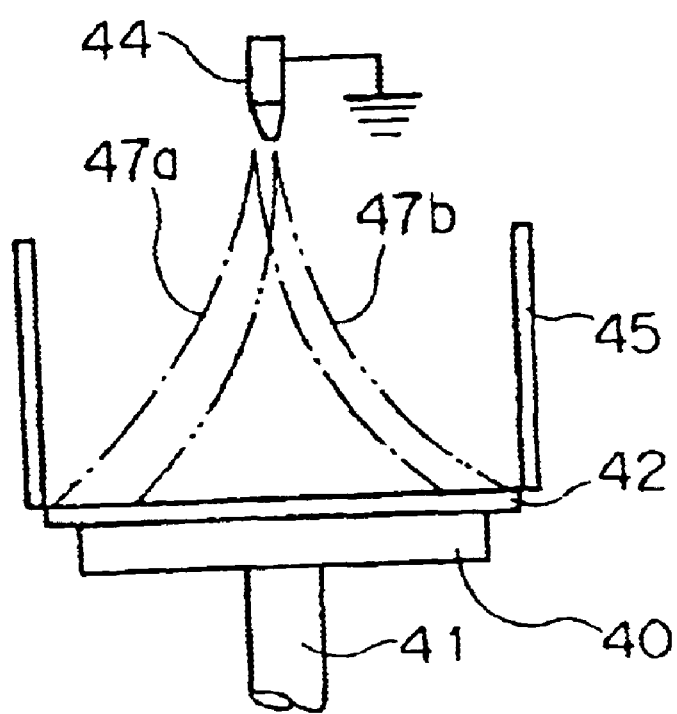
FIG. 7 is a schematic view of an apparatus for spin-coating a semiconductor substrate, in accordance with the second embodiment of the present invention.

FIG. 7 illustrates a spin-coating apparatus in accordance with the second embodiment. Parts or elements that correspond to those of the spin-coating apparatus illustrated in FIG. 5 have been provided with the same reference numerals.

In the second embodiment, a voltage which varies periodically with the lapse of time is applied to the quadrant electrodes situated facing each other. For instance, the power sources $V_1$ and $V_3$ apply voltages V1 and V3 to the first and third quadrant electrodes 45a and 45c, respectively. The first and third quadrant electrodes 45a and 45c face each other, and the voltages V1 and V3 vary periodically with the lapse of time.

For instance, the voltages V1 and V3 may be defined as follows.

$$V1=V\cos(at)$$

$$V3=-V\cos(at)$$

As the voltages V1 and V3 vary, as illustrated in FIG. 7, flow of the chemical 43 is periodically scanned between a path indicated with a one-dot chain line 47a and a path indicated with a two-dot chain line 47b. That is, the chemical 43 is dropped in a scan mode. Hence, it is possible to spread the chemical 43 to a periphery of the semiconductor substrate 42.

The spin-coating apparatus in accordance with the second embodiment is useful in particular for the semiconductor substrate 42 having a long diameter. In addition, since the spin-coating apparatus in accordance with the second embodiment has no mechanical movable portions, no particles are generated, and hence, the chemical 43 can be dropped in a scan mode in a long term.

Furthermore, variance in dimension of the spray nozzle 44 and in location of the spray nozzle 44 can be absorbed by controlling the voltages V1 and V3 to be applied to the first and third quadrant electrodes 45a and 45c.

[Third Embodiment]

Figure 8:
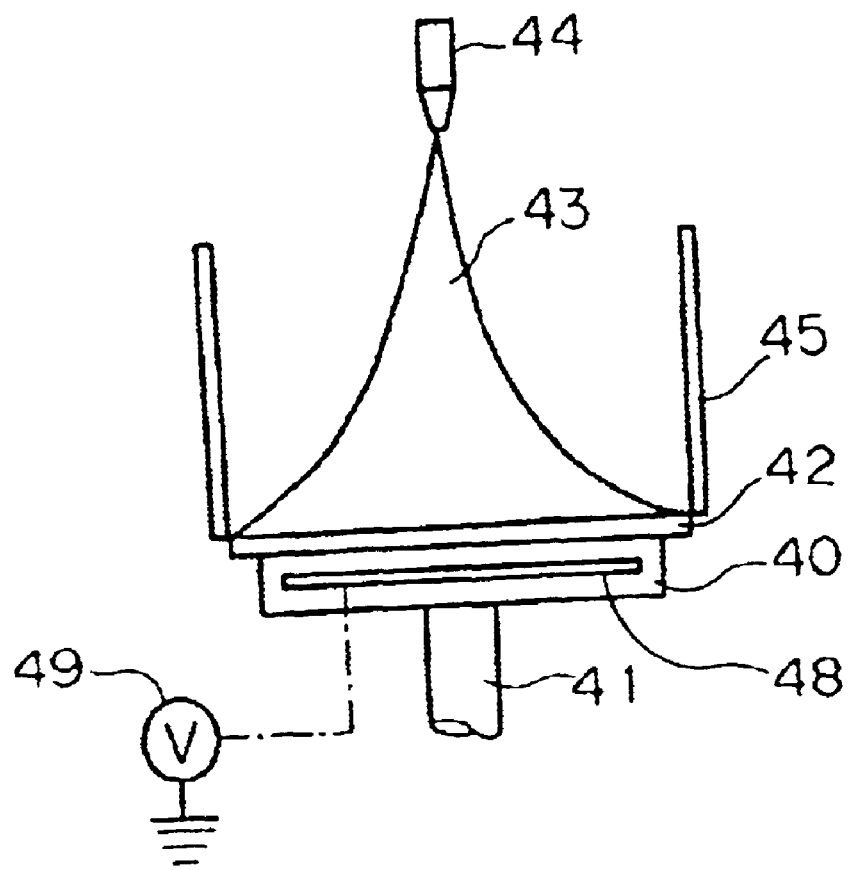
FIG. 8 is a schematic view of an apparatus for spin-coating a semiconductor substrate, in accordance with the third embodiment of the present invention.

FIG. 8 illustrates a spin-coating apparatus in accordance with the third embodiment. Parts or elements that correspond to those of the spin-coating apparatus illustrated in FIG. 5 have been provided with the same reference numerals.

The spin-coating apparatus in accordance with the third embodiment includes a second electrode 48 embedded in the rotary table 40. The second electrode 48 is electrically connected to a power source 49. Similarly to the first to fourth power sources $V_1$, $V_2$, $V_3$ and $V_4$, the power source 49 applies a voltage having an electric polarity opposite to an electric polarity of particles of the chemical 43, to the second electrode 48.

In accordance with the spin-coating apparatus, the electrode 45 attracts the chemical 43 towards a periphery of the semiconductor substrate 42 to thereby uniformly spread the chemical 43 over the semiconductor substrate 42, and concurrently, the second electrode 48 attracts the chemical 43 towards a surface of the semiconductor substrate 42. Hence, it is ensured that the chemical 43 is uniformly coated onto the semiconductor substrate 42.

[Fourth Embodiment]

Figure 9:
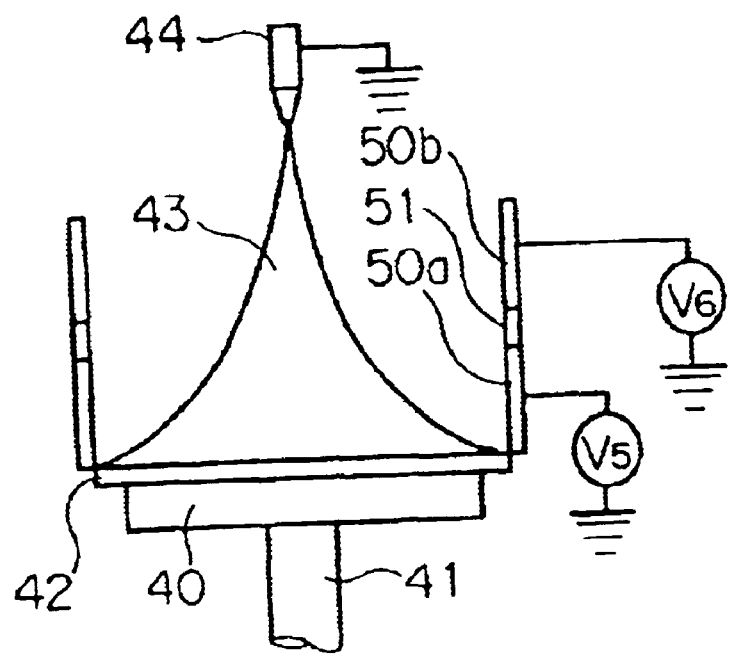
FIG. 9 is a schematic view of an apparatus for spin-coating a semiconductor substrate, in accordance with the fourth embodiment of the present invention.

FIG. 9 illustrates a spin-coating apparatus in accordance with the fourth embodiment. Parts or elements that correspond to those of the spin-coating apparatus illustrated in FIG. 5 have been provided with the same reference numerals.

In the third embodiment, each of the first to fourth quadrant electrodes 45a to 45d is comprised of two vertically-split electrodes 50a and 50b. Electrical insulators 51 are sandwiched between the vertically-split electrodes 50a and 50b.

The vertically-split electrodes 50a and 50b are electrically connected to power sources $V_5$ and $V_6$, respectively.

For instance, the power source $V_5$ applies a voltage V5 to the lower electrode 50a, and the power source $V_6$ applies a voltage V6 smaller than the voltage V5, to the upper electrode 50b (V5>V6).

Thus, as the chemical 43 approaches the semiconductor substrate 42, the electric field applies a greater force to the chemical 43, which would ensure that the chemical 43 is spread to a periphery of the semiconductor substrate 42.

Though the first to fourth quadrant electrodes 45a to 45d are vertically divided into two pieces, the number of pieces is not to be limited to two. The electrode 45 may be vertically divided into 3 or greater.

In the above-mentioned first to fourth embodiments, the electrode 45 is designed to be vertically movable relative to the semiconductor substrate 42. Instead, the electrode 45 may be designed to be rotatable around the semiconductor substrate 42.

For instance, when the electrode 45 is to be formed as a single cylindrical electrode, if there is generated a difference in an intensity of the electric field among regions of the electrode 45, such a difference in an intensity of the electric field can be cancelled by rotating the electrode 45 around the semiconductor substrate 42. Thus, it is possible to generate an electric field having a uniform intensity.

[Fifth Embodiment]

Hereinbelow is explained a method of spin-coating a semiconductor substrate in accordance with the fifth embodiment, with reference to FIGS. 5 and 6.

The method is comprised of the first step of dropping the chemical 43 onto the semiconductor substrate 42, the second step of rotating the semiconductor substrate 42 about a rotation axis thereof, and the third step of generating an electric field around the semiconductor substrate 42 which electric field has an electric polarity opposite to an electric polarity of particles contained in the chemical 43.

For instance, the third step may be carried out by arranging the electrode 45 having a ring-shaped cross-section, around the semiconductor substrate 42, as illustrated in FIG. 6.

An order for carrying out the first to third steps is not to be limited to the first-second-third order. For instance, the first and third steps may be concurrently carried out, and thereafter, the second step may be carried out. An order for carrying out the first to third steps may be selected in any way, unless the electric field exerts on the chemical 43 while the chemical 43 is dropping onto the semiconductor substrate 42.

An intensity of the electric field may be locally varied circumferentially of the semiconductor substrate 42. For instance, as illustrated in FIG. 6, an intensity of the electric field can be locally varied circumferentially of the semiconductor substrate 42 by differentiating voltages applied to the first to fourth quadrant electrodes 45a, 45b, 45c and 45d, from one another.

An intensity of the electric field may be varied not for all of the first to fourth quadrant electrodes 45a, 45b, 45c and 45d, but for some of those. For instance, an intensity of the electric field may be varied for the first and third quadrant electrodes 45a and 45c located facing each other.

As an alternative, an intensity of the electric field may be locally varied vertically relative to the semiconductor substrate 42.

For instance, as illustrated in FIG. 9, the first to fourth quadrant electrodes 45a to 45d may be vertically divided into two pieces, and different voltages may be applied to the two pieces to thereby vertically locally vary the intensity.

As an alternative, an intensity of the electric field may be varied periodically with the lapse of time. For instance, the power sources $V_1$ and $V_3$ may apply voltages V1 and V3 to the first and third quadrant electrodes 45a and 45c, respectively. The voltages V1 and V3 are voltages periodically varying with lapse of time. For instance, the voltages V1 and V3 may be defined as follows.

$$V1 = V \cos(at)$$

$$V3 = -V \cos(at)$$

As illustrated in FIG. 8, a second electric field may be generated below the semiconductor substrate 42 for attracting particles of the chemical 43.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-346766 filed on Dec. 7, 1998 including specification, claims, drawings and summary is incorporated herein by reference in its entirety.

What is claimed is:

1. A method of spin-coating a semiconductor substrate, comprising the steps of:
   (a) dropping coating material onto a semiconductor substrate;
   (b) rotating said semiconductor substrate about a center thereof; and
   (c) generating an electric field circumferentially around said semiconductor substrate and said coating material, said electric field having an electric polarity opposite to an electric polarity of said coating material, wherein said electric field is generated by at least one electrode positioned circumferentially around said semiconductor substrate and wherein said at least one electrode is rotatable about said center of said semiconductor substrate separately from rotation of said semiconductor substrate.

2. The method as set forth in claim 1, further comprising the step of locally varying an intensity of said electric field circumferentially of said semiconductor substrate.

3. The method as set forth in claim 2, wherein an intensity of said electric field is varied in regions of said semiconductor substrate circumferentially facing each other.

4. The method as set forth in claim 1, further comprising the step of locally varying an intensity of said electric field vertically of said semiconductor substrate.

5. The method as set forth in claim 1, further comprising the step of varying an intensity of said electric field periodically with lapse of time.

6. The method as set forth in claim 1, further comprising the step of generating a second electric field below said semiconductor substrate by a voltage having an electric polarity opposite to an electric polarity of said coating material.

7. The method as set forth in claim 1, wherein a force applied to said coating material by said electric field is almost equal to a gravitational force exerted on said coating material.

* * * * *